(12) United States Patent
Robinson et al.

(10) Patent No.: US 6,476,400 B1
(45) Date of Patent: Nov. 5, 2002

(54) METHOD OF ADJUSTING A LITHOGRAPHY SYSTEM TO ENHANCE IMAGE QUALITY

(75) Inventors: Christopher F. Robinson, Hyde Park; Michael S. Gordon, Lincolndale; Scott A. Messick, Pleasant Valley, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/469,159

(22) Filed: Dec. 21, 1999

(51) Int. Cl.[7] ............................. G21K 5/10; H01J 37/08
(52) U.S. Cl. ................................................. 250/492.22
(58) Field of Search .......................... 250/492.2, 492.22

(56) References Cited

U.S. PATENT DOCUMENTS

| | | | |
|---|---|---|---|
| 4,859,856 A | 8/1989 | Groves et al. | |
| 4,945,246 A | 7/1990 | Davis et al. | |
| 5,210,696 A | * 5/1993 | Yano | 250/492.2 |
| 5,241,185 A | * 8/1993 | Meiri et al. | 250/492.2 |
| 5,466,904 A | 11/1995 | Pfeiffer et al. | |
| 5,557,105 A | 9/1996 | Honjo et al. | |
| 5,760,410 A | * 6/1998 | Matsuki et al. | 250/398 |
| 5,824,437 A | 10/1998 | Sakakibara et al. | |
| 5,952,155 A | 9/1999 | Sakakibara et al. | |
| 5,962,859 A | 10/1999 | Groves et al. | |
| 5,981,962 A | 11/1999 | Groves et al. | |
| 6,106,979 A | * 8/2000 | Pierrat | 430/5 |
| 6,255,024 B1 | * 7/2001 | Pierrat | 250/492.2 |

* cited by examiner

Primary Examiner—Jack Berman
Assistant Examiner—Johnnie L. Smith, II
(74) Attorney, Agent, or Firm—Cantor Colburn LLP; Ira Blecker

(57) ABSTRACT

A method of adjusting a lithography system or tool to enhance image quality correction is presented. The method enhances image quality correction by using a reduced dose during exposure of the lithographic test patterns. A typical lithography system (tool) comprises an exposure column unit and a control unit. The exposure column unit generates a shaped beam and directs this shaped beam through lenses and a series of deflectors to a mask which is positioned on a movable stage. The control unit provides control management for the components of the exposure column unit. The system maximizes pattern resolution using a mask having test pattern geometries that are at least the same size as the geometries of the pattern of a production mask. The reduced exposure dose used for the lithographic test patterns results in greater sensitivity to small beam setup errors. This enables finer tuning of the lithographic tool through adjustments in lens currents and correction coil currents and thereby results in improved resolution for production integrated circuits.

14 Claims, 3 Drawing Sheets

Off-Axis Stigmator varied by column

In-Axis Stigmator varied by row

FIG. 2

Off-Axis Stigmator varied by column

In-Axis Stigmator varied by row

FIG. 3

METHOD OF ADJUSTING A LITHOGRAPHY SYSTEM TO ENHANCE IMAGE QUALITY

FIELD OF THE INVENTION

This invention relates to integrated circuit lithography, in particular, to a method of adjusting a lithography system or tool to enhance image quality correction by using a reduced exposure dose during setup of the lithography system or tool.

BACKGROUND OF THE INVENTION

Electronic beam systems have been employed for microfabrication of large scale integrated circuits on semiconductor substrates. Typically patterns are written on radiation sensitive materials usually composed of photoresist, deposited on targets such as substrates in the form of semiconductor wafers (in what is referred to a 'direct write' lithography process) or photolithographic masks (for use in mask lithography). The electron beam exposes the radiation sensitive material and a pattern is developed on the wafer or in the mask. A typical electron beam system includes an electron beam source, a deflection system for deflecting the electron beam in a predetermined pattern and magnetic projection lenses for focusing the electron beam at the target.

The aforementioned lithography mask is used in projecting the pattern onto substrates, i.e, semiconductor wafers. More specifically, the pattern on the mask is optically projected by, e.g., ultraviolet light onto the wafer. This process is more common in high volume production applications.

Also, masks formed of a plate of material which is capable of blocking or scattering an electron beam have been used for lithography. Such masks are sometimes referred to as blocking masks or scattering masks. In a stencil mask application, the plate has apertures therethough defining the desired pattern. Another application known as a SCALPEL™ scattering mask incorporates a thin layer of patterned highly scattering material on a thin membrane of weakly scattering material. An electron beam is projected at the mask in question and through the apertures or unclad membrane to project the patten onto substrates, i.e, semiconductor wafers.

Both direct write and projection lithography systems require adjustments during setup to optimize image quality (e.g., focus, astigmatism, etc.) and thereby maximize pattern resolution. Obviously, there are tradeoffs between resolution, cost and production requirements and pattern resolution is maximized in view of these often competing requirements.

By way of example, when maximizing pattern resolution in a system employing a mask (scattering or blocking mask) it is common to set the lithography system up using a test pattern. This test pattern would have lines or elements which are smaller (or finer) than the lines or elements of a production pattern. Lines of the production pattern may be, for example, 200 nm, whereby lines of the test pattern would be 100 nm. In this way, the lithography system is adjusted to optimize image quality (e.g., focus, astigmatism, etc.) based on the 100 nm lines, thus providing a higher sensitivity to misadjustments than if the system was adjusted using the 200 nm lines. This approach has worked well for many years. However, as the industry continues to demand smaller and smaller microscopic patterns it becomes more and more difficult to obtain the desired test pattern resolution. This is primarily due to limitations in manufacturing masks, in this case test masks are required to have patterns that are even smaller (or finer) than the now smaller demanded production patterns.

SUMMARY OF THE INVENTION

The above-discussed and other drawbacks and deficiencies of the prior art are overcome or alleviated by the method of adjusting a lithography system or tool to enhance image quality correction of the present invention. In accordance with the present invention, the method enhances image quality correction by using a reduced beam exposure dose during setup of the lithography system or tool.

A typical projection electron beam lithography system comprises an exposure column unit and a control unit. The exposure column unit generates a shaped beam and directs this shaped beam through a series of deflectors to a mask which is positioned on a movable stage. The control unit provides control management for the components of the exposure column unit. In the prior art, pattern resolution in the system was maximized using a test pattern on a mask having geometries which are smaller than the geometries of a production pattern on a mask. In the present invention, the system maximizes pattern resolution using a mask having test pattern geometries that are at least the same size as the geometries of the pattern of a production mask. However, unlike in the prior art, the beam exposes the radiation sensitive material on the test wafers for a period of time shorter than the nominal exposure. Adjustments to the system during setup are made in the same manner as in the prior art, e.g., current changes to lenses and correction coils, deflection positioning and stage positioning.

The above-discussed and other features and advantages of the present invention will be appreciated and understood by those skilled in the art from the following detailed description and drawings.

BRIEF DESCRIPTION OF THE DRAWINGS

Referring now to the drawings wherein like elements are numbered alike in the several FIGURES:

FIG. 2 is a diagrammatic view of a test pattern at 1.0×nominal exposure (dose) evidencing the present invention;

FIG. 3 is a diagrammatic view of the test pattern of FIG. 2 at 0.9×nominal exposure (dose) evidencing the present invention;

DESCRIPTION OF THE PREFERRED EMBODIMENT

Figure 1:
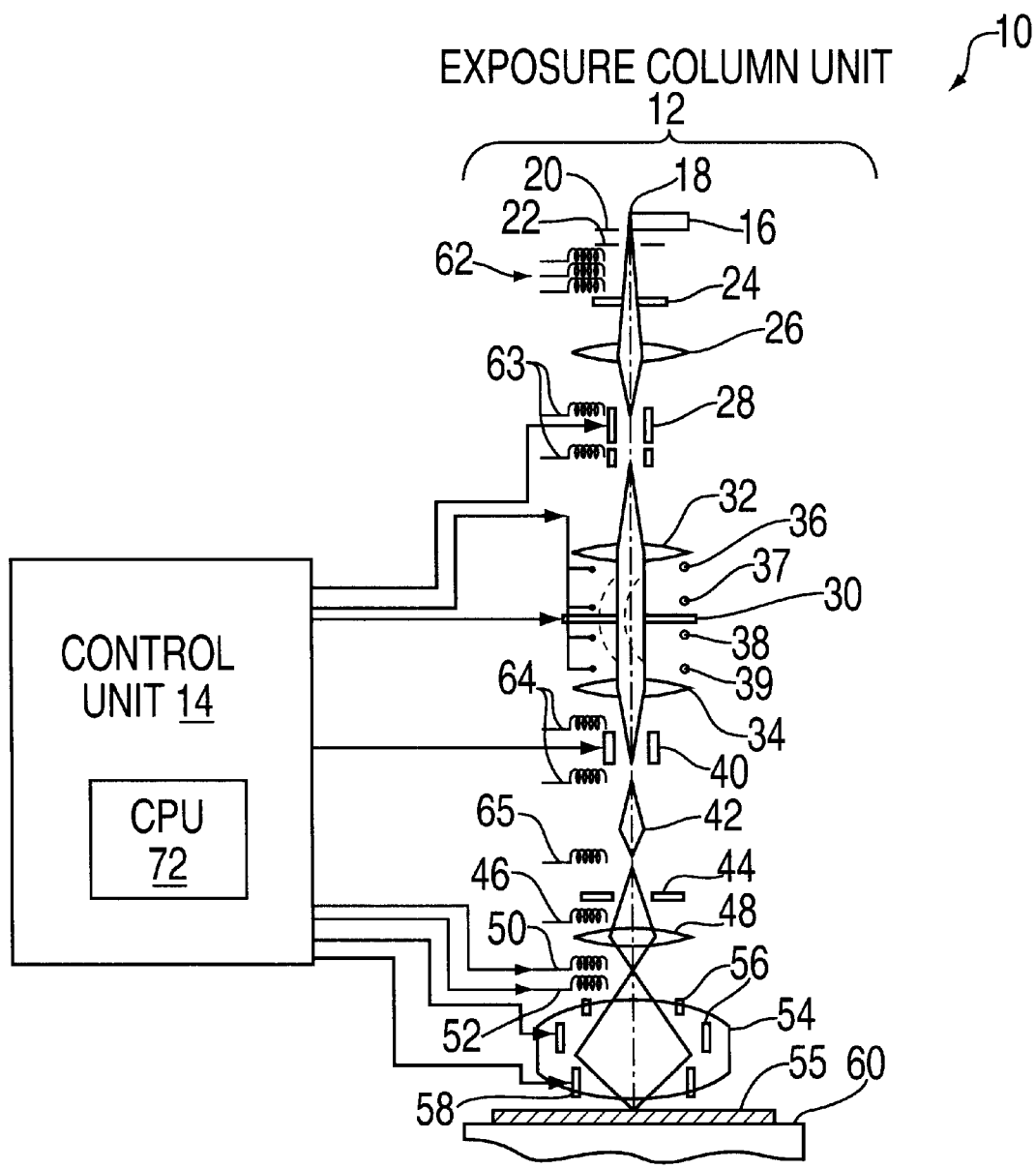
FIG. 1 is a block diagram of a typical lithography system using a blocking mask.

Referring to FIG. 1, a typical projection electron beam lithography system is generally shown at 10. Lithography system 10 comprises an exposure column unit 12 and a control unit 14. The exposure column unit 12 includes an electron beam generator 16 having a cathode 18, a grid 20 and an anode 22. A slit 24 is provided in the exposure column unit 12 for rectangular shaping of the electron beam. A lens 26 is provided for converging this shaped beam. A slit deflector 28 is provided for deflecting a position of the shaped beam to a mask 30 based on a deflection signal. The mask 30 is mounted movably in a horizontal direction between two opposing lenses 32 and 34. Deflectors 36–39 are provided to deflect the beam between lenses 32 and 34 based on position information to select an aperture in the mask 30. The exposure column unit 12 further includes a blanking aperture electrode 40 for cutting off or passing the beam in response to a blanking signal, a lens 42 for converging the beam, an aperture 44, a refocus coil 46 and a lens 48. Also, a dynamic focus coil 50, a set of dynamic stigmator coils 52, an objective lens 54 projecting the beam onto a wafer 55 are provided. A main deflector 56 and a sub deflector 58 position the beam on the wafer in response to exposure position signals. A stage 60 for carrying the wafer and moving it in X-Y directions and alignment coils 62–65 are provided. Such is merely exemplary of a typical exposure control unit. The control unit 14 includes a processor 72 and associated memory having stored design data. Control management for each of the aforementioned components is provided by control unit 14, as is well known. Details of the control management are well known and are not the subject of the present invention. Such lithography systems are well known and the above is provided for illustration purposes only, it is not in any way intended to limit the present invention which is applicable to lithography systems/tools in general.

In the prior art, pattern resolution in the system was maximized using a test pattern on a mask. This test pattern would have geometries (e.g., lines or elements) which are smaller (or finer) than the lines or elements of a production pattern on a production mask. In the present invention, the system maximizes pattern resolution using a test mask having test pattern geometries that are the same size as (and even larger than that of) the geometries of a production pattern of a production mask. However, unlike in the prior art, the test wafer is exposed to the test mask image for a period of time shorter than a product pattern exposure. It has been found that image quality differences are more easily detected at these lower exposure dose levels, just as they are also more easily detected with smaller (finer) geometries in the prior art. Adjustments to the system during setup are made in the same manner as in the prior art, such being well known, e.g., current changes to lenses and correction coils, deflection positioning and stage positioning. In this way, smaller geometries for the pattern of the test mask are not required.

Figure 4:
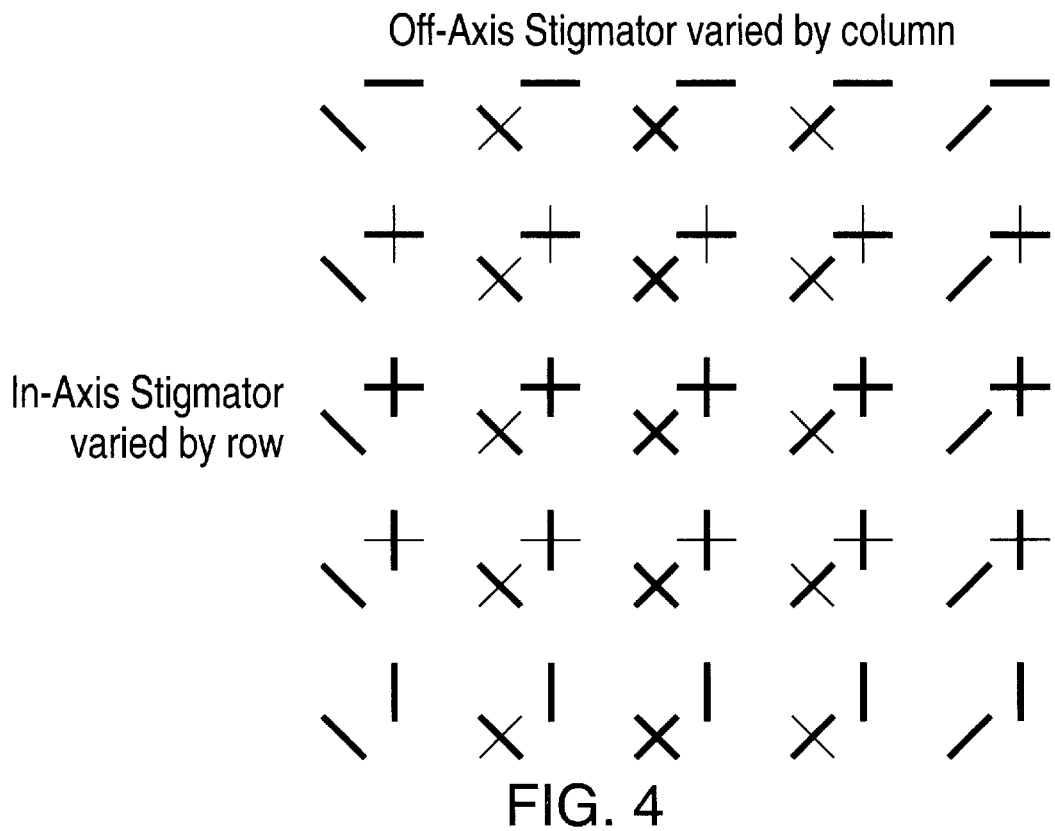
FIG. 4 is a diagrammatic view of the test pattern of FIG. 2 at 0.8×nominal exposure (dose) evidencing the present invention.

The ease in detection of image quality differences is evidenced with reference to FIGS. 2–4, where a five-by-five test patten of a x+ symbol is shown with the in-axis stigmator varied by row and the off-axis stigmator varied by column. In FIG. 2 the test pattern is exposed at 1.0×nominal dose and the x+ symbols all appear to be of similarly good image quality. However, in FIG. 3 the test pattern is exposed at 0.9×nominal dose and the x+ symbols at the perimeter are clearly of a lesser quality than the x+ symbols at the center. One can see that the rectangles that make up the x+ symbols are no longer of uniform width and quality. This is even more prominent in FIG. 4 where the test pattern is exposed at 0.8×nominal dose. At this level information is lost at the perimeter and the apparent image quality degrades the further away from the center these features are located. A review of these FIGS. 2–4 clearly shows that evaluating the image quality at a below nominal dose level would enhance the sensitivity to stigmator adjustment errors. This enables an operator to make more accurate stigmator correction adjustments and thereby improves the resolution for product patterns exposed at the nominal dose levels. In other words, adjusting the system at the 0.8×nominal dose (FIG. 4) for optimal image quality would provide better ultimate pattern resolution than adjusting the system at 1.0×nominal dose (FIG. 2), since small errors are more readily apparent. The exposure dose of these symbols (features) at 10%–20% below that required for normal resolution, is such that the bottoms of the processed features are just on the verge of clearing to the substrate interface after normal development. In this state small variations in the system image quality have a dramatic effect on the perceived quality of the developed feature (symbol).

Testing of this process on an electron beam projection lithography tool with a particular resist process has shown that by dosing a stigmator varied pattern with 200 nm features at ~85% of the nominal dose, the clearing of the features is so marginal that one can easily discern the best image quality parameters using an optical microscope for evaluation. Scanning electron microscope evaluation of 80 nm lines and spaces printed after image quality adjustment confirmed these results. For other resist processes the optimum test pattern dose would have to be determined by experimentation, but should be in the range of 75–90% of the nominal dose.

Figure 5:
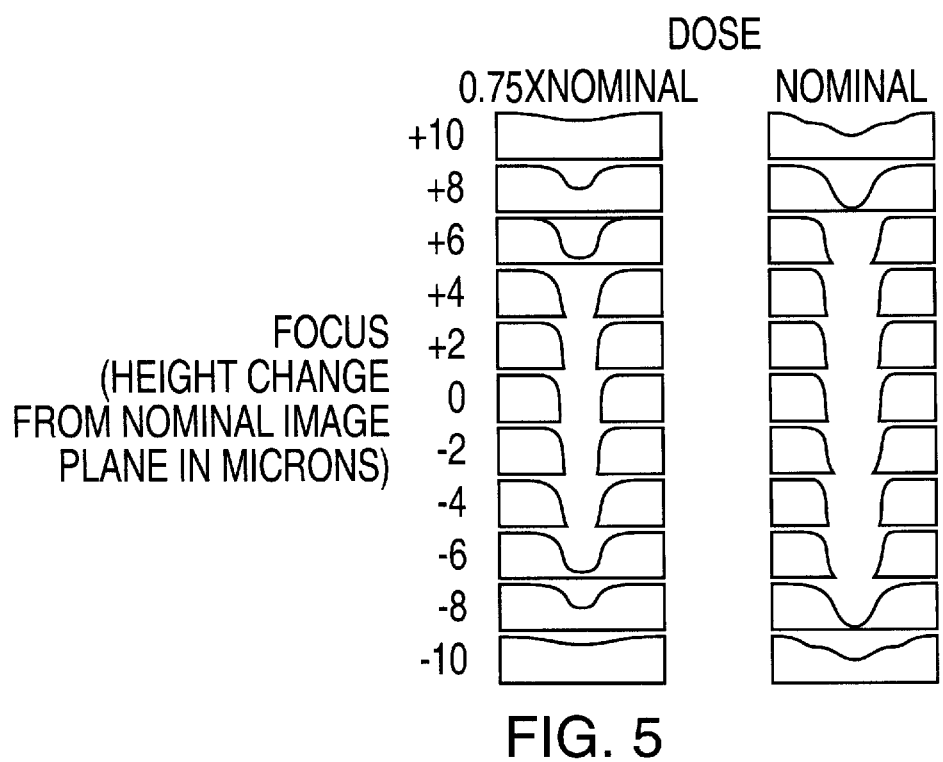
FIG. 5 is a diagrammatic view illustrating a simulation of developed trenches evidencing the present invention.

Referring to FIG. 5, a simulation of developed trenches is shown at a nominal dose and at 0.75×nominal dose at focus settings from −10 microns to +10 microns. At the nominal dose the developed trenches for all focus settings in the range −6 microns through +6 microns from the nominal image plane would look similar based on top down optical microscope evaluation. At 0.75×nominal dose for the resist conditions simulated here a noticeable difference in the trenches occurs at focus settings of −4 microns and +4 microns from the nominal image plane, further evidencing the advantages of the present invention.

While the above exemplary embodiment is direct towards lithography using a mask with an electron beam such is equally applicable to lithography using a mask with an ultraviolet light (beam) and direct write lithography with an electron beam. In each of these lithography systems, the system can be adjusted to maximize pattern resolution using the method (process) of the present invention. In direct write lithography a test pattern is written at a reduced exposure dose, with such information being used for setup of the system. Also in developing a pattern on a mask (a photolithographic mask) using an electron beam, a test pattern can be projected at a reduced exposure dose, with such information being used for setup of the system.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A method of adjusting a lithography system, said lithography system including adjustable apparatus for generating a beam and directing the beam to a production mask and onto a target area, said mask having a pattern to be projected onto the target area, said method comprising:

positioning a test mask at a location of the production mask in the lithography system, said test mask having a pattern with geometries of about the size of geometries of the pattern of the production mask;

projecting the beam to said test mask and thereby projecting the pattern of said test mask onto the target area at an exposure dose below the nominal exposure dose of the pattern of the production mask, thereby forming an underexposed image on the target area; and adjusting the adjustable apparatus of the lithography system based on quality of the underexposed image on the target area.

2. The method of claim 1 wherein the pattern of said test mask has geometries larger than the size of geometries of the pattern of the production mask.

3. The method of claim 1 wherein said exposure dose is 10%–25% below the nominal exposure dose of the pattern of the production mask.

4. The method of claim 1 wherein the beam comprises an electron beam or an ultraviolet beam.

5. The method of claim 1 wherein a substrate is positioned at the target area.

6. The method of claim 5 wherein said substrate comprises a semiconductor wafer.

7. The method of claim 5 wherein said exposure dose is such that geometries of the pattern of said test mask are on the verge of clearing to the substrate interface after development of the substrate.

8. A method of adjusting a lithography system, said lithography system including adjustable apparatus for generating a beam and directing the beam onto a target to develop a production pattern thereon, wherein the improvement comprises:

projecting the beam, at an exposure dose below a nominal exposure dose of the production pattern, onto the target to develop an underexposed test pattern thereon, said underexposed test pattern having geometries of about the size of geometries of the production pattern; and adjusting the adjustable apparatus of the lithography system based on quality of said underexposed test pattern.

9. The method of claim 8 wherein said test pattern has geometries larger than the size of geometries of the production pattern.

10. The method of claim 8 wherein said exposure dose is 10%–25% below the nominal exposure dose of the production pattern.

11. The method of claim 8 wherein the beam comprises an electron beam.

12. The method of claim 8 wherein said target comprises a substrate.

13. The method of claim 12 wherein said substrate comprises a semiconductor wafer or a photolithographic mask.

14. The method of claim 12 wherein said exposure dose is such that geometries of the test pattern are on the verge of clearing to the substrate interface after development of the substrate.

* * * * *